(12) United States Patent
Oka et al.

(10) Patent No.: US 6,814,591 B2
(45) Date of Patent: Nov. 9, 2004

(54) ELECTRICAL CONNECTOR HOUSING

(75) Inventors: Tatsuya Oka, Yokkaichi (JP); Kouichi Okada, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 359 days.

(21) Appl. No.: 09/934,468

(22) Filed: Aug. 23, 2001

(65) Prior Publication Data

US 2002/0025699 A1 Feb. 28, 2002

(30) Foreign Application Priority Data

Aug. 24, 2000 (JP) ........................................ 2000-254430

(51) Int. Cl.[7] ........................... H01R 13/648; H01R 4/66
(52) U.S. Cl. ..................................................... 439/94.9
(58) Field of Search ................................ 439/76.2, 949

(56) References Cited

U.S. PATENT DOCUMENTS

| | | | | |
|---|---|---|---|---|
| 4,415,830 A | * | 11/1983 | Pugh et al. .................. | 313/331 |
| 4,439,801 A | * | 3/1984 | Fajt ............................ | 361/55 |
| 5,578,008 A | * | 11/1996 | Hara ....................... | 604/96.01 |
| 5,703,757 A | | 12/1997 | Hayes et al. ................. | 361/752 |
| 5,877,944 A | * | 3/1999 | Onizuka ..................... | 439/76.2 |
| 6,126,457 A | * | 10/2000 | Smith et al. ................ | 439/76.2 |
| 6,224,397 B1 | * | 5/2001 | Nakamura ................. | 439/76.2 |
| 6,270,360 B1 | * | 8/2001 | Yanase ....................... | 439/76.2 |
| 6,309,226 B1 | * | 10/2001 | Nakatani ................... | 739/76.2 |
| 6,354,846 B1 | * | 3/2002 | Murakami ................ | 439/76.2 |
| 2001/0012736 A1 | * | 8/2001 | Miyajima et al. .......... | 439/76.2 |

FOREIGN PATENT DOCUMENTS

| | | |
|---|---|---|
| EP | 1018783 | 7/2000 |
| EP | 1024212 | 8/2000 |
| EP | 1026287 | 8/2000 |
| JP | 62-12321 | 1/1987 |
| JP | 11252745 | 9/1999 |

OTHER PUBLICATIONS

English Language Abstract of JP 11–252745.

* cited by examiner

*Primary Examiner*—Hae Moon Hyeon
(74) *Attorney, Agent, or Firm*—Greenblum & Bernstein, P.L.C.

(57) ABSTRACT

An electrical connector housing includes a first shell mountable on a second shell. The first shell is provided with connector mounts to be fit with connectors, fuse mounts to be fit with fuses and relay mounts to be fit with relays. The electrical connector housing contains a busbar stack which includes a connector circuitry module containing connector-connecting circuits, a fuse circuitry module containing fuse-connecting circuits, and a relay circuitry module containing relay-connecting circuits. In this manner, only the busbars contained in the fuse-connecting circuits and those contained in the relay-connecting circuits can be formed of a copper alloy which is harder than pure copper. As a result, the busbar terminals of the fuse-and relay-connecting circuits can be connected directly to the fuse and the relays, respectively. The electrical connector housing thus configured has a simple structure, and can be constructed without increasing costs.

2 Claims, 4 Drawing Sheets

ELECTRICAL CONNECTOR HOUSING

BACKGROUND OF THE INVENTION

1. Field of the Invention

The present invention generally pertains to an electrical connector housing to be mounted in a vehicle, e.g. an automobile (car). In particular, the invention relates to an electrical connector housing including separate busbar modules for connecting connectors, fuses and relays, so that the materials of busbars for each module can be chosen appropriately.

2. Description of Background Information

Electrical devices for vehicles, such as relays, fuses and connectors, are generally held in an electrical connector housing, which is in turn mounted inside a vehicle. Such an electrical connector housing contains various kinds of electrical devices connected through connector circuits, which are commonly composed of busbars.

FIG. 1 shows a known electrical connector housing 51 including a first shell 52 and a second shell 53 fit thereto. The first shell 52 is fit with connector mounts (not shown in the figures), relay mounts 54 and fuse mounts 55. The connector mounts hold corresponding connectors (not shown in the figures). Likewise, the fuse mounts 55 hold corresponding fuses (not shown in the figures) by means of intermediate terminals 62a, while the relay mounts 54 hold corresponding relays (not shown in the figures) by means of intermediate terminals 62b.

The electrical connector housing 51 contains a busbar stack 56 formed by alternating layers of a group of busbars 60 made of pure copper, and an insulator sheet 61. The busbar stack 56 includes a connector circuitry module 57, a fuse circuitry module 58 and a relay circuitry module 59. The connector circuitry module 57 is connected to the connector mounts, and is connected to the connectors to be fit therein. Likewise, a fuse circuitry module 58 is connected to the fuse mounts 55, and connected to the fuses to be fit therein, whilst the relay circuitry module 59 is connected to the relay mounts 54, and is connected to the relays to be fit therein.

However, the busbars 60 consisting of pure copper are very soft, and cannot be connected directly to the fuses and relays. For these reasons, the intermediate terminals 62a and 62b are provided at positions between the busbars 60 and the fuse and relay terminals. As a result, in the prior art electrical connector housings 51, the number of electrical components tends to increase, and the housing structure is rather complex.

To circumvent such problems, attempts have been made to replace the pure copper of busbars with a harder copper alloy, and to obviate the intermediate terminals 62a and 62b. However, the busbars 60 connected to the connectors, the fuses and the relays are usually contained in an electrical connector housing in a mixed form, so that the pure copper material of all the busbars 60 must be replaced by a copper alloy. The costs necessary for the replacement then often exceed those for installing the intermediate relays 62a and 62b, and increase the housing's construction costs.

SUMMARY OF THE INVENTION

The present invention has been conceived to solve such problems, and provides an electrical connector housing that has a simpler structure and can be manufactured with lesser costs.

To this end, the present invention provides an electrical connector housing including a first shell and a second shell mounted on it. The first shell is provided with connector mounts to be fit with connectors, fuse mounts to be fit with fuses and relay mounts to be fit with relays. The electrical connector housing also contains a busbar stack which includes a connector circuitry module containing connector-connecting circuits connected to the connector mounts, a fuse circuitry module containing fuse-connecting circuits connected to the fuse mounts, and a relay circuitry module containing relay-connecting circuits connected to the relay mounts.

In the present invention, the fuse-connecting circuits contain first busbars with first tabs, while the relay-connecting circuits contain second busbars with second tabs.

Furthermore, at least one of the first busbars and the second busbars is formed of a resilient conductor harder than pure copper.

The first tabs and the second tabs are then directly connected to the fuses and the relays, respectively.

The resilient conductor that is harder than pure copper is preferably a copper alloy.

Alternatively, the resilient conductor that is harder than pure copper is iron.

The fuse circuitry module is formed in a suitable manner integrally with the relay circuitry module, and the first busbars are formed unitarily and in one piece with the second busbars.

Typically, the first tabs and the second tabs are provided with notches configured to hold the fuses and the relays respectively.

In a first embodiment of the present invention, the busbars forming at least one of the fuse-connecting circuits and relay-connecting circuits are formed of a copper alloy which is harder than pure copper, so that intermediate terminals commonly installed between the tab sections of busbar and the fuses and relays can be obviated. Furthermore, the connector-connecting circuits, the fuse-connecting circuits and the relay-connecting circuits are formed into separate modules. In this manner, only the busbars that form the fuse-connecting circuits and relay-connecting circuits can be composed of a copper alloy. As a result, the replacement costs are kept lower than the costs for providing the intermediate terminals. The electrical connector housing thus produced has a simpler structure and incurs lower costs.

In a second embodiment of the present invention, the busbars forming the fuse-connecting circuits and those forming the relay-connecting circuits are formed integrally, so that areas for busbar connections are reduced in size. This in turn makes it easier to manufacture the electrical connector housing, and miniaturize its structure.

In a third embodiment of the present invention, the end sections of fuses and relays are held by notched sections in the busbar terminals, so that the fuses and the relays are more securely connected to the busbar terminals (tab sections of busbars).

BRIEF DESCRIPTION OF THE DRAWINGS

The above, and the other, objects, features and advantages of the present invention will be made apparent from the following description of the preferred embodiments, given as non-limiting examples, with reference to the accompanying drawings, in which.

DETAILED DESCRIPTION OF THE PREFERRED EMBODIMENTS

Figure 1:
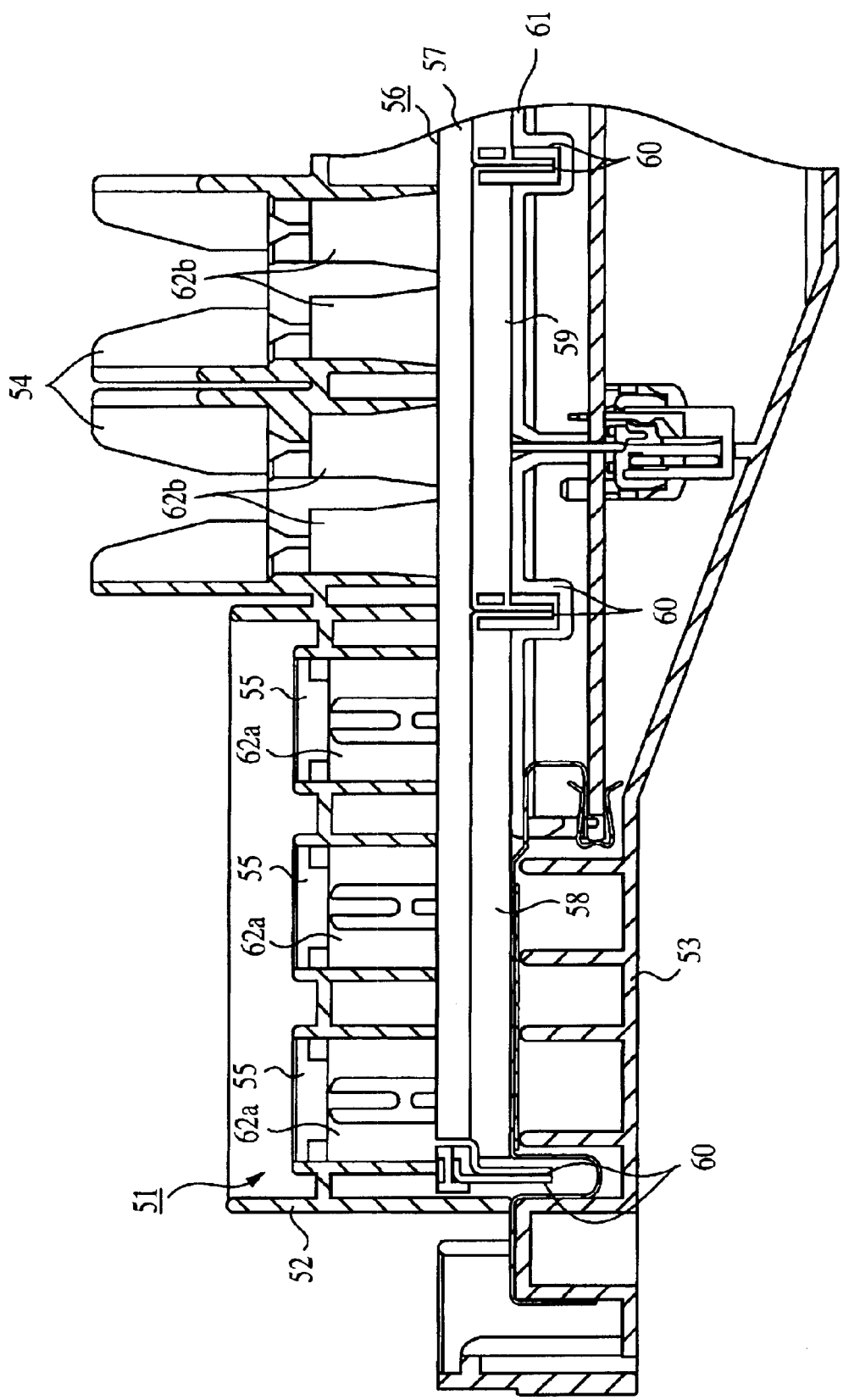
FIG. 1 is a cross-sectional view of a prior art electrical connector housing.
Figure 2:
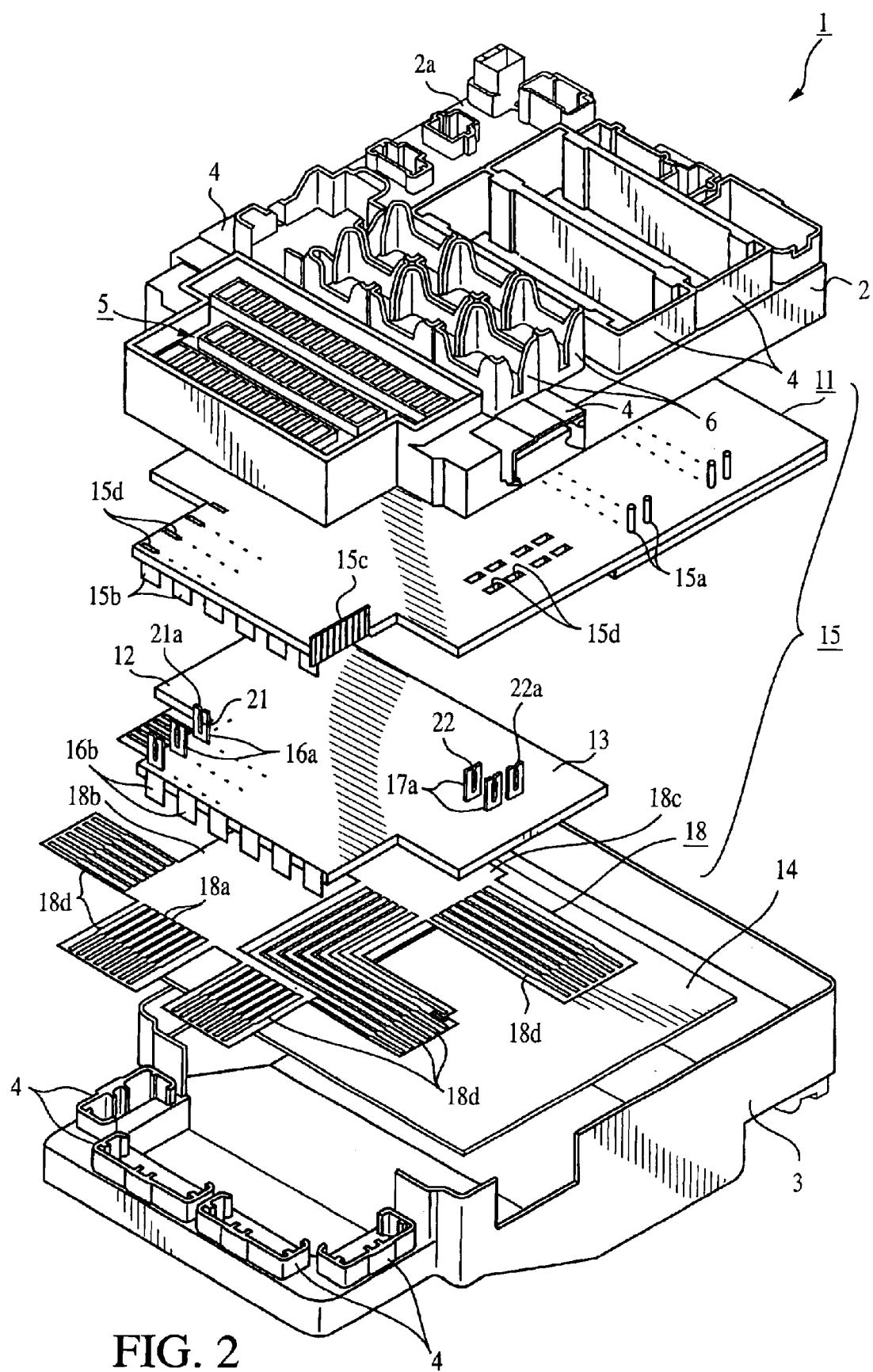
FIG. 2 is an exploded perspective view of an electrical connector housing in one embodiment of the present invention.
Figure 3:
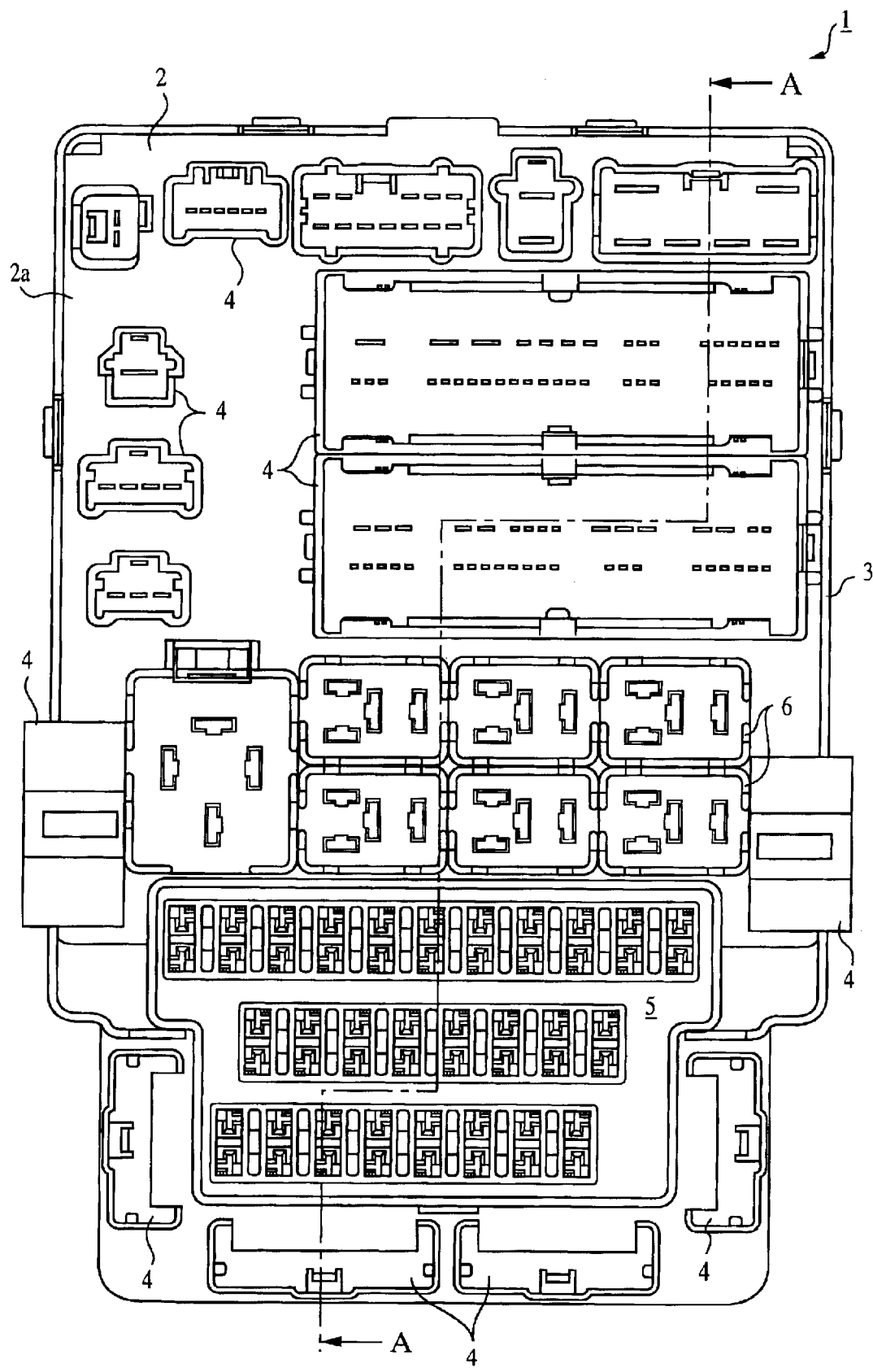
FIG. 3 is a plan view of the electrical connector housing in FIG. 2.
Figure 4:
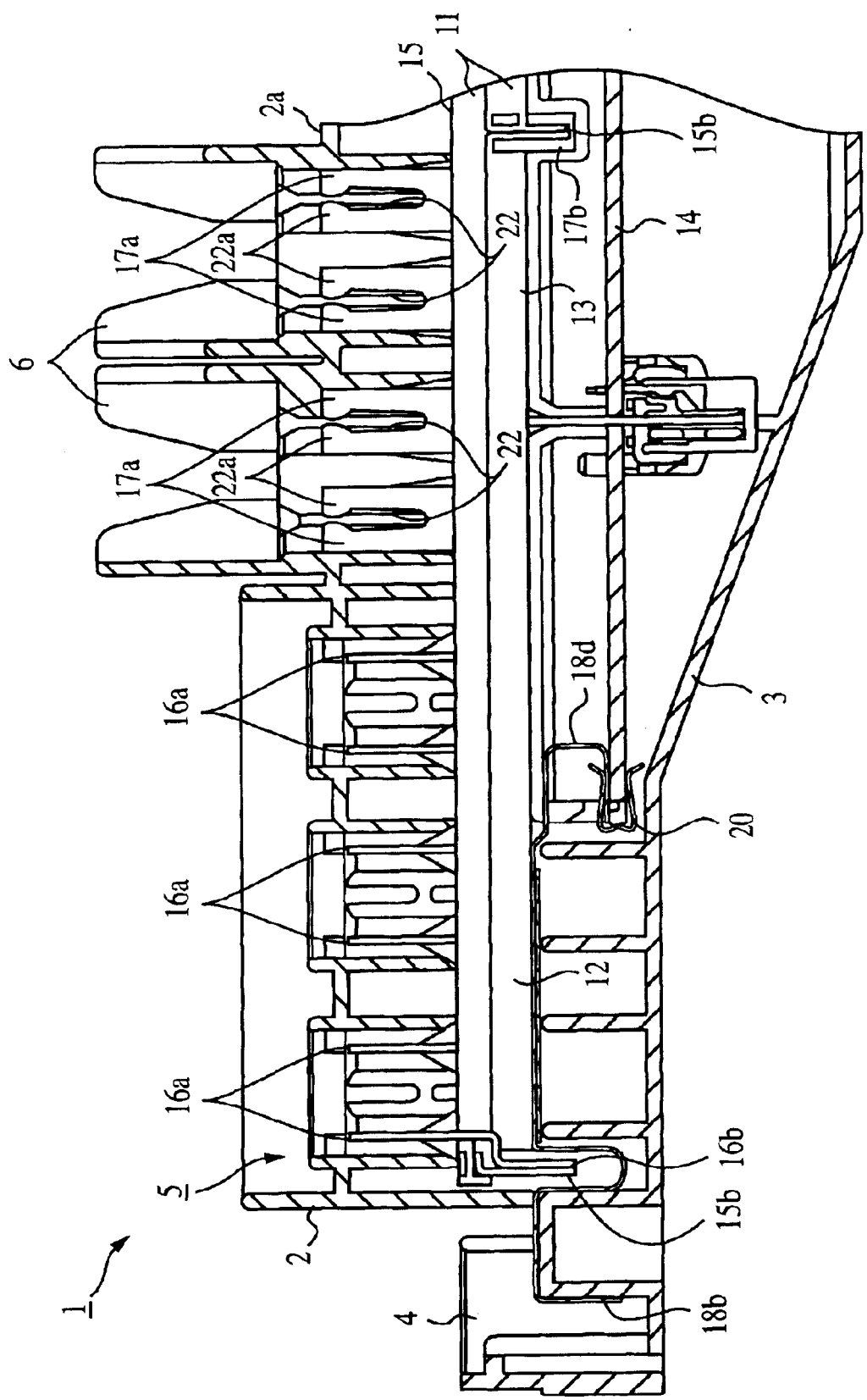
FIG. 4 is a cross-sectional view along line A—A in FIG. 3.

As shown in FIGS. 2–4, the electrical connector housing 1 of the present invention includes a first shell 2 (upper shell) mountable on a second shell 3 (lower shell). The first shell has a first face 2a, on which connector mounts 4, fuse mounts 5 and relay mounts 6 are provided. The connector mounts 4 can be fit with connectors (not shown in the figures). Likewise, the fuse mounts 5 can be fit with fuses (not shown), while the fuse mounts 6 can be fit with fuses (also not shown). The first shell 2 and the second shell 3, when fit, form a box having an internal space.

Such an electrical connector housing 1 contains a printed circuit 14 and a busbar stack 15. The busbar stack 15 is formed by alternating layers of a group of busbars including an elastic conductor of a given shape, and a layer of insulator material made, for example, of a synthetic resin. The busbar stack 15 includes a flexible printed circuit 18, a connector circuitry module 11, a fuse circuitry module 12 and a relay circuitry module 13. The flexible printed circuit 18 is formed, for example, by coating suitably shaped copper foil patterns 18a with resin sheets. It has a two-layered structure including a first circuit 18b and a second circuit 18c. Both the first and second circuits 18b and 18c thus contain corresponding copper foil patterns 18a, which are electrically connected to each other, for example, by ultrasonic welding. In the present embodiments, the copper foil patterns 18a are formed with a thickness of about 0.1 mm, so that a maximum current of 6 Amperes can be passed.

The positions on the flexible printed circuit 18 corresponding to the connector mounts 4 are provided with connecting end sections 18d. As shown in FIG. 4, the connecting terminals 18d are formed by bending so as to make contact with conductor patterns (not shown in the figures) on the printed circuit 14. The connecting end sections 18d and the printed circuit 14 are then clamped with clips 20, so that the connecting end sections 18d and the conductor patterns on the printed circuit 14 are electrically connected. Furthermore, as shown in FIG. 4, the connecting end sections 18d are introduced into corresponding connector mounts 4.

The connector circuitry modules 11 are connected to the flexible printed circuit 18, as well as into the connector mounts 4, thereby forming connector-connecting circuits. Of these circuits, the circuits for a current below 6 Amperes (light current range) are formed of the flexible printed circuit 18. Conversely, the circuits for a current above 6 Amperes (heavy current area) are formed by the connector circuitry module.

The connector circuitry module 11 has an area somewhat smaller than the top surface area of the first shell 2. It has a partly two-layered structure, the remainder having a four-layered structure. The busbars forming the connector circuitry module 11 are made of pure copper. As shown in FIGS. 2 and 4, the top face (facing the first shell) of the connector circuitry module 11 is provided with a plurality of busbar terminals 15a projecting upward therefrom. These busbar terminals 15a are formed by bending a part of corresponding busbars, and placed at the positions corresponding to those of the connector mounts 4 on the first shell 2. The busbar terminals 15a are thus connected to the connector mounts 4, and can be linked to the connectors to be fit therein. As further shown in FIG. 4, a side face of the connector circuitry module 11 and the bottom face (facing the second shell 3) thereof are each provided with a plurality of strips 15b projecting downwardly therefrom. These strips 15b are also formed by bending a part of corresponding busbars. Furthermore, another side face of the connector circuitry module 11 is provided with printed circuit connecting sections 15c projecting upwardly therefrom. These circuit connecting sections 15c are also formed by bending a part of corresponding busbars upward. The connector circuitry module 11 is also provided with holes 15d, through which busbar terminals 16a and 17a (also termed "tabs") can be passed.

The fuse circuitry module 12 is connected to the fuse mounts 5, and forms fuse-connecting circuits. The fuse circuitry module 12 has a two-layered structure. The busbars contained in the fuse circuitry module 12 are made of a copper alloy harder than pure copper. Opposing side faces of the fuse circuitry module 12 are each provided with a plurality of strips 16b projecting downwardly therefrom. These strips 16b are placed so as to be joined to the strips 15b of the connector circuitry module 11. Furthermore, the top face (facing the first shell 2) of the fuse circuitry module 12 is provided with a plurality of busbar terminals 16a projecting upwardly therefrom. These busbar terminals 16a are formed by bending a part of corresponding busbars, and are placed at the positions corresponding to those of the fuse mounts 5. The busbar terminals 16a are thus connected to the fuse mounts 5, and connected to the fuses. The edge of each busbar terminal 16a is formed into a notch 21 extending along the busbar length, so that the edge includes opposing holder tips 21a, which can directly hold the end section of a fuse.

The relay circuitry module 13 has a two-layered structure, and is formed integrally with the fuse circuitry module 12. The relay circuitry module 13 is connected to the relay mounts 6, and forms relay-connecting circuits. The busbars contained in the relay circuitry module 13 are formed unitarily and in one piece with those contained in the fuse circuitry module 12. Accordingly, they are also made of a copper alloy which is harder than pure copper. The top face of the relay circuitry module 13 is provided with a plurality of busbar terminals 17a projecting upward therefrom. These busbar terminals 17a are formed by bending a part of corresponding busbars, and are placed at the positions corresponding to the relay mounts 6. The busbar terminals 17a are thus connected to the relay mounts 6, and can be connected to relays to be fit therein. As is further shown in FIG. 4, the edge of a busbar is formed into a notch 22 extending along the busbar length, so that it includes opposing holder tips 22a configured to directly hold a relay end section. As shown in FIG. 4, a side face of the relay circuitry module 13 is provided with a plurality of strips 17b projecting downwardly therefrom. These strips 17b are formed so as to be joined to the strips 15b of the connector circuitry module 11.

In the busbar stack 15, the connector circuitry module 11 forms the top layer (facing the first shell 2), while the fuse and relay circuitry modules 12 and 13 form an intermediate layer, and the flexible printed circuit 18 forms the bottom layer (facing the second shell 3). In other words, the two-layered structure section of the connector circuitry module 11 has the fuse circuitry module 12 and the relay circuitry module 13 added to it from below. Furthermore, the incorporated modules 11, 12 and 13 then have the flexible printed circuit 18 added to them from below. Accordingly, the flexible printed circuit 18 is arranged adjacent to the face of modules where no busbar terminal 15a, 16a or 17a is located. Furthermore, the flexible printed circuit 18 has a printed circuit 14 added to it from below (from the side of the second shell 3).

When each circuitry module 11, 12 or 13 is placed in the electrical connector housing 1, the busbar terminals 16a and 17a of the respective fuse and relay circuitry modules 12 and 13 are passed through the holes 15d in the connector circuitry module 11. In this state, the strips 15b, 16b and 17b of the corresponding circuitry module 11, 12 and 13 are joined to each other, as shown in FIG. 4. They are then bonded e.g. by ultrasonic welding, so that all the circuitry modules 11, 12 and 13 are electrically connected to each other.

The above embodiments give rise to the following advantageous effects.

(1) The busbars contained in the fuse and relay circuitry modules are composed of a copper alloy that is harder than pure copper, so that their busbar terminals 16a and 17a can be directly connected to the end sections of the fuses and relays. As a result, the intermediate terminals 62a and 62b, hitherto installed between the tabs of busbars 60 and the fuses or relays, are not needed. Furthermore, the connector-connecting circuits, fuse-connecting circuits and relay-connecting circuits are each formed into a module, so that they can be configured in a separate and concentrated fashion. In contrast to circuits designed as in the prior art, such a separately configured structure allows a proportion of the pure copper busbar material to be replaced by a copper alloy. For instance, only the busbars contained in the fuse and relay circuitry modules 12 and 13 can be made of a copper alloy. In this manner, the costs for replacing pure copper by a copper alloy can be reduced below those for installing the intermediate terminals 62a and 62b. The electrical connector housing 1 can thus have a simpler structure, and can be constructed with reduced costs.

(2) The busbars in each case contained in the fuse circuitry module 12 and the relay circuitry module 13 can be formed unitarily and in one piece, so that the number of connections between the busbars can be minimized in the busbar stack 15. The electrical connector housing 1 can thus be manufactured more easily. Moreover, the space for installing the busbars-connecting sections can be reduced, so that the electrical connector housing 1 can be miniaturized.

(3) The busbars contained in the fuse circuitry module 12 and the relay circuitry module 13 are formed of a resilient conductor, and include edge notches 21 and 22, so that the end sections of the fuse and relays are firmly held by the notches 21 and 22. The fuses and relays can thus be connected to the busbar terminals 16a and 17a in a much more reliable way than in the prior art cases.

The present invention also relates to the following embodiments, modified from the above mentioned ones.

The busbars contained in the fuse circuitry module 12 and those contained in the relay circuitry module 13 may be formed separately, instead of unitarily. Thereafter, one of the fuse busbars and the relay busbars may be formed of a copper alloy, and the other of pure copper.

Alternatively, one of the fuse busbars and the relay busbars may be formed of a copper alloy, while the latter may be formed of another suitable resilient metal, e.g., iron.

Furthermore, the busbars contained in the fuse circuitry module 12 and those contained in the relay circuitry module 13 may be formed separately, but both groups of busbars may each be formed of a copper alloy.

The notches 21 and 22 for holding the fuses or the relays may not include a holder tip 21a or 22a, or include only a single holder tip 21a or 22a.

Alternatively, these notches 21 and 22 may be replaced by holes formed in the fuse and relay, and mating hooks formed on a side face of the busbar terminals 16a and 17a, so that the busbar terminals 16a and 17a can be connected to the respective fuses and relays by hooking.

When the electrical connector housing 1 is mounted in a vehicle, it can be placed upside down or turned down through 90 degrees, so that the positions of the first shell 2 and the second shell 3 are reversed, or a side face of the housing is placed at the top. Specifically, the electrical connector housing 1 can be mounted in a vehicle turned in any direction.

Although the invention has been described with reference to particular means, materials and embodiments, it should be understood that the invention is not limited to the particulars disclosed and extends to all equivalents within the scope of the claims.

The present disclosure relates to subject matter contained in priority Japanese Application No. 2000-254430, filed on Aug. 24, 2000, which is herein expressly incorporated in its entirety.

What is claimed is:

1. An electrical connector housing comprising a first shell mountable on a second shell, the first shell provided with connector mounts to be fit with connectors, fuse mounts to be fit with fuses and relay mounts to be fit with relays, said electrical connector housing containing a busbar stack which includes a connector circuitry module forming a top layer facing the first shell and containing connector-connecting circuits connected to the connector mounts, a fuse circuitry module containing fuse-connecting circuits connected to the fuse mounts, and a relay circuitry module containing relay-connecting circuits connected to the relay mounts, the fuse circuitry module and the relay circuitry module forming a layer provided below the connector circuitry module;

said fuse-connecting circuits containing first busbars with first tabs, and said relay-connecting circuits containing second busbars with second tabs;

at least one of said first busbars and said second busbars being formed of a resilient conductor harder than pure copper;

said first tabs and said second tabs formed of a resilient conductor harder than pure copper so that said first tabs and said second tabs are directly connectable to said fuses and said relays, respectively; and said connector-connecting circuits containing third busbars, said third busbars formed of pure copper;

wherein said fuse circuitry module is formed integrally with said relay circuitry module, and said first busbars are formed unitarily and in one piece with said second busbars;

said resilient conductor that is harder than pure copper is a copper alloy or iron; and said fuse circuitry module contains a plurality of first downwardly projecting strips, said relay circuitry module contains a plurality of second downwardly projecting strips, and said connector circuitry module contains a plurality of third downwardly projecting strips, said first, second, and third downwardly projecting strips connected by welding so that said fuse circuitry module, said relay circuitry module, and said connector circuitry module are electrically connected to each other.

2. The electrical connector housing as claimed in claim 1, wherein said first tabs and sadi second tabs are provided with notches respectively configured to hold said fuses and said relays.

* * * * *